US009831380B2

(12) United States Patent
Park et al.

(10) Patent No.: US 9,831,380 B2
(45) Date of Patent: Nov. 28, 2017

(54) METHOD OF MANUFACTURING SEMICONDUCTOR DEVICE PACKAGE

(71) Applicant: SAMSUNG ELECTRONICS CO., LTD., Suwon-si, Gyeonggi-do (KR)

(72) Inventors: Jung Kyu Park, Seoul (KR); Wan Jong Kim, Hwaseong-si (KR); Young Geun Jun, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/752,632

(22) Filed: Jun. 26, 2015

(65) Prior Publication Data
US 2016/0064633 A1    Mar. 3, 2016

(30) Foreign Application Priority Data

Sep. 2, 2014 (KR) .................. 10-2014-0115965

(51) Int. Cl.
| H01L 21/48 | (2006.01) |
| H01L 21/301 | (2006.01) |
| H01L 21/304 | (2006.01) |
| H01L 21/78 | (2006.01) |
| H01L 23/495 | (2006.01) |
| H01L 41/338 | (2013.01) |

(Continued)

(52) U.S. Cl.
CPC ...... H01L 33/0095 (2013.01); H01L 21/4842 (2013.01); H01L 23/49562 (2013.01); H01L 24/97 (2013.01); H01L 2224/16245 (2013.01); H01L 2933/0066 (2013.01)

(58) Field of Classification Search
CPC ............... H01L 33/62; H01L 33/0095; H01L 2933/0033; H01L 24/98
USPC .......................................................... 438/27
See application file for complete search history.

(56) References Cited

U.S. PATENT DOCUMENTS

| 5,569,625 A * | 10/1996 | Yoneda ................. H01L 21/565 |
| | | 257/E21.504 |
| 6,372,608 B1 | 4/2002 | Shimoda et al. |
| 6,645,830 B2 | 11/2003 | Shimoda et al. |

(Continued)

FOREIGN PATENT DOCUMENTS

| JP | 2013-077728 | 4/2013 |
| JP | 2014-082408 | 5/2014 |

(Continued)

*Primary Examiner* — Moazzam Hossain
(74) *Attorney, Agent, or Firm* — Muir Patent Law, PLLC

(57) ABSTRACT

A method of manufacturing a semiconductor device package includes: forming a based frame provided with an outer frame, a plurality of unit frames spaced apart from the outer frame by separating grooves interposed therebetween, and a first connector and a second connector forming connections between each of the plurality of unit frames and the outer frame; forming a package body in each of the plurality of unit frames to allow a mounting area of each unit frame to be open; removing one of the first connector and second the connector connected to each unit frame; mounting a semiconductor device in the mounting area of the unit frame; and cutting the other of the first connector and second the connector connected to each unit frame and separating, from the base frame, the unit frame in which the package body is formed.

19 Claims, 27 Drawing Sheets

(51) Int. Cl.
*H01L 33/00* (2010.01)
*H01L 23/00* (2006.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,530,250 B2 | 9/2013 | Ichikawa et al. | |
| 8,536,604 B2 | 9/2013 | Kwak et al. | |
| 8,735,931 B2 | 5/2014 | Han et al. | |
| 8,766,295 B2 | 7/2014 | Kim | |
| 9,029,197 B2* | 5/2015 | Funatsu | H01L 24/37 438/112 |
| 9,324,642 B2* | 4/2016 | Puschner | H01L 23/49541 |
| 2004/0020037 A1* | 2/2004 | Arneson | G06K 19/07718 29/825 |
| 2012/0025360 A1* | 2/2012 | Xue | H01L 23/49524 257/676 |
| 2012/0074451 A1* | 3/2012 | Lin | H01L 33/62 257/99 |
| 2013/0087826 A1 | 4/2013 | Kim | |
| 2013/0221509 A1* | 8/2013 | Oda | H01L 24/97 257/676 |
| 2013/0256854 A1* | 10/2013 | Kobayashi | H01L 23/49568 257/675 |
| 2014/0020926 A1* | 1/2014 | Feng | H01L 23/495 174/68.1 |
| 2014/0054078 A1 | 2/2014 | Bae et al. | |
| 2014/0087520 A1* | 3/2014 | Funatsu | H01L 24/37 438/112 |
| 2014/0252582 A1* | 9/2014 | Nakabayashi | H01L 23/49503 257/676 |
| 2015/0034998 A1* | 2/2015 | Nakabayashi | H01L 24/97 257/99 |

FOREIGN PATENT DOCUMENTS

| | | |
|---|---|---|
| KR | 1020100005852 | 1/2010 |
| KR | 1020120051380 | 5/2012 |
| KR | 1020120116595 | 10/2012 |
| KR | 1020130049896 | 5/2013 |

* cited by examiner

METHOD OF MANUFACTURING SEMICONDUCTOR DEVICE PACKAGE

CROSS-REFERENCE TO RELATED APPLICATION

This application claims priority to Korean Patent Application No. 10-2014-0115965 filed on Sep. 2, 2014, with the Korean Intellectual Property Office, the entire contents of which are hereby incorporated by reference.

TECHNICAL FIELD

The present disclosure relates to a method of manufacturing a semiconductor device package.

BACKGROUND

In general, a light emitting device using a light emitting diode (LED) chip as a light source has a package structure provided with a transparent encapsulation covering the LED chip, and a body as a support structure which includes a lead for electrical connection.

LED chips having a flip chip form have been developed in order to enhance a performance thereof. However, such LED chips are vulnerable to external impacts due to having a light emitting surface and a bonded surface thereof adjacent to one another. Due to the above issue, flip chip type LED chips mainly use ceramic materials having similar thermal expansivity to that of the LED chips as packaging materials. However, due to a high cost of materials and an essential dicing process which is relatively expensive, such ceramic materials are considered inherently disadvantageous.

In terms of costs of packaging materials and process, a scheme of directly mounting LED chip on a lead frame and cutting by using a trimming process is desirable. However, such a process may be somewhat problematic, in that a solder on which the LED chip is mounted or the body of the package may be damaged due to mechanical impacts occurring during the cutting performed in the trimming process.

SUMMARY

An aspect of the present disclosure may provide a solution to prevent damage to the light emitting diode (LED) chip by reducing the mechanical impact applied to the LED chip or the body of the light emitting device package during a process of cutting the base frame into individual light emitting devices, such as the trimming process.

According to an aspect of the present disclosure, a method of manufacturing a semiconductor device package may include: forming a base frame provided with an outer frame, a plurality of unit frames spaced apart from the outer frame by separating grooves interposed therebetween, and a first connector and a second connector forming connections between each of the plurality of unit frames and the outer frame; forming a package body in each of the plurality of unit frames to allow a mounting area in each unit frame to be open; removing one of the first connector and the second connector connected to each unit frame; mounting a semiconductor device in the mounting area of the unit frame; and cutting the other of the first connector and the second connector connected to each unit frame, and separating, from the base frame, the unit frame in which the package body is formed.

The plurality of unit frames may be disposed at intervals, and the first connector and the second connector may be disposed on both sides of each unit frame facing one another.

The first connector and the second connector may extend in a first direction, and one of the first connector and the second connector disposed between the plurality of unit frames may further extend in a second direction perpendicular to the first direction so as to be connected to the outer frame.

The unit frame may include a first lead frame and a second lead frame, and the first connector and the second connector may be each connected to both sides of the first lead frame and the second lead frame.

The mounting of the semiconductor device in the mounting area of the unit frame may include mounting in a flip chip bonding manner using a solder interposed between the mounting area and the semiconductor device.

The removing of one of the first connector and the second connector connected to each unit frame may include cutting and removing one of the first connector and the second connector in a state in which the outer frame and the package body are supported on a die.

The separating of the unit frame from the base frame may include cutting and separating the other of the first connector and the second connector connected to each unit frame in the state in which the outer frame is supported on the die.

The method of manufacturing the semiconductor device package may further include forming an encapsulating portion to encapsulate the semiconductor device mounted in the mounting area.

The package body may be provided with a recess opening the mounting area and accommodating the semiconductor device, and the encapsulating portion may be formed to fill the recess.

The encapsulating portion may include a wavelength converting material or a light diffusing material.

According to another aspect of the present disclosure, a method of manufacturing a semiconductor device package may include forming a base frame provided with an outer frame, a plurality of unit frames spaced apart from the outer frame by separating grooves interposed therebetween, and a first connector and a second connector forming connections between each of the plurality of unit frames and the outer frame; forming a package body in each of the plurality of unit frames to allow a mounting area of each unit frame to be open; mounting a semiconductor device in the mounting area of the unit frame; removing one of the first connector and the second connector connected to each unit frame; and cutting the other of the first connector and the second connector connected to each unit frame, and separating, from the base frame, the unit frame in which the package body is formed.

The plurality of unit frames may be disposed at intervals, and the first connector and the second connector may be disposed at both sides of each unit frame facing one another.

The removing of one of the first connector and the second connector connected to each unit frame may include cutting and removing one of the first connector and the second connector disposed between the plurality of unit frames.

The separating of the unit frame from the base frame may include removing one of the first connector and the second connector connected to each unit frame, and cutting and separating the other of the first connector and the second connector supporting the unit frame and thereby maintaining a connection between the unit frame and the base frame.

The method of manufacturing the semiconductor device package may further include forming an encapsulating portion to encapsulate the semiconductor device mounted in the mounting area.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
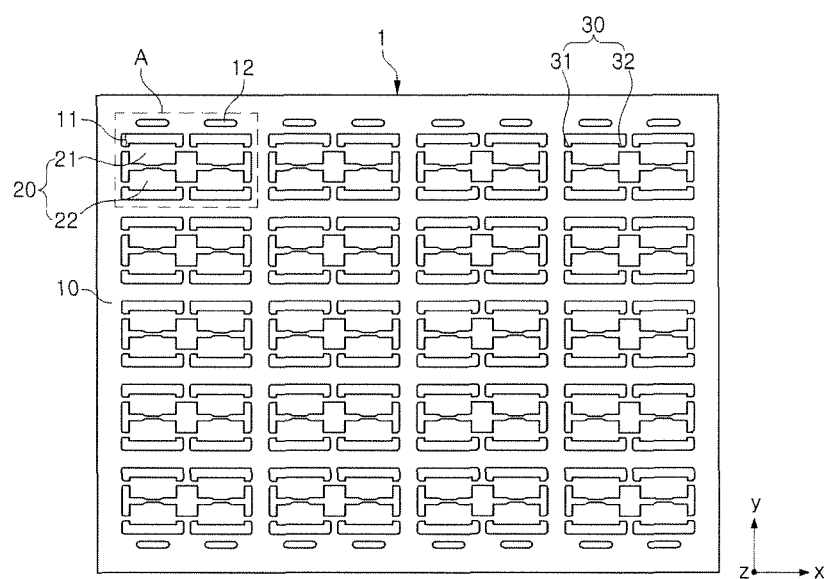
FIG. 1 is a top plan view schematically illustrating a base frame used in a method of manufacturing a semiconductor device package according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements. In the present specification, terms such as "top," "top surface," "lower surface" "below," and the like, are determined based on the drawings, and in actuality, the terms may be changed according to a direction in which a device is disposed in actuality.

Referring to FIGS. 1 through 8, a method of manufacturing a semiconductor device package according to an exemplary embodiment of the present disclosure will be described.

Figure 2:
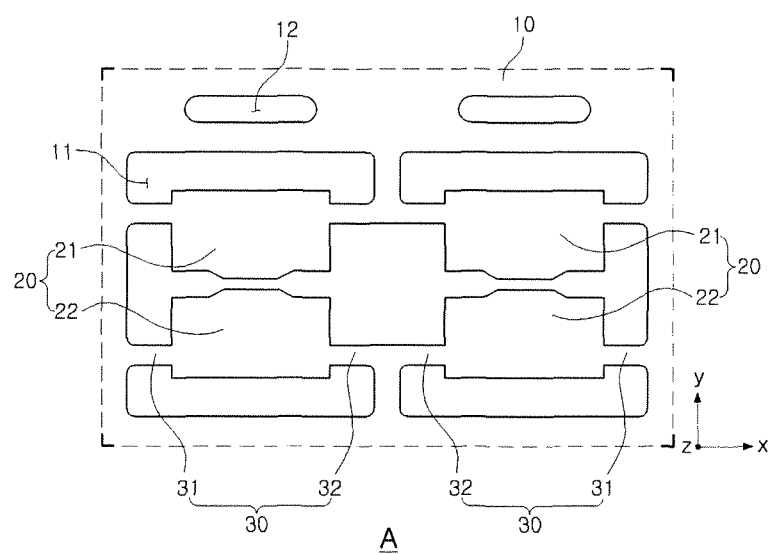
FIG. 2 is a top plan view illustrating area A of FIG. 1.
Figure 8:
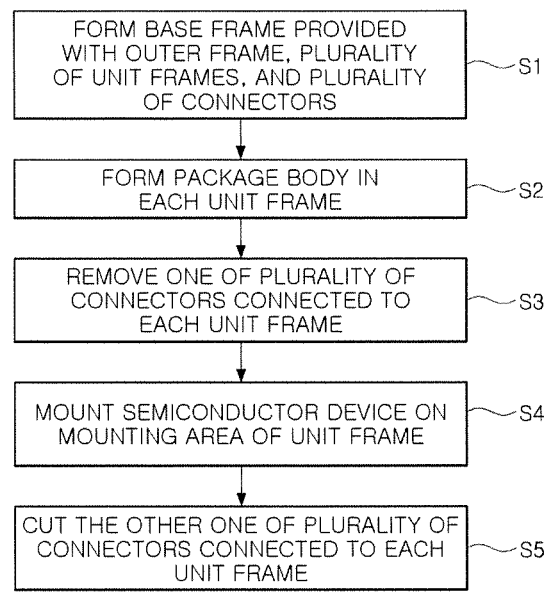
FIG. 8 is a flowchart illustrating a method of manufacturing a semiconductor device package according to an exemplary embodiment of the present disclosure.

As illustrated in FIGS. 1, 2, and 8, in operation S1 of FIG. 8, a base frame 1 may be formed to include an outer frame 10, a plurality of unit frames 20 spaced apart from the outer frame 10 by separating grooves 11 interposed therebetween, and a plurality of connectors 30 forming connections between each of the plurality of unit frames 20 and the outer frame 10.

For example, the base frame 1 may have a plate structure provided in a rectangular form. The base frame 1 may be formed of a material having high electrical conductivity and light reflectivity. Such a material may include a metal, for example, silver (Ag), aluminum (Al), copper (Cu), nickel (Ni), gold (Au), chromium (Cr), titanium (Ti), or alloys thereof; however, the type of material is not limited thereto.

The plurality of unit frames 20 may be disposed inside the outer frame 10 forming an outer peripheral portion of the base frame 1, in a first direction and a second direction with intervals therebetween. As used herein, the first direction may be defined as an X axis direction, a horizontal direction, and the second direction may be defined as a Y axis direction, a vertical direction.

The plurality of unit frames 20 may be provided as lead frames for mounting semiconductor device packages, respectively, and each of the unit frames 20 may include a first lead frame 21 and a second lead frame 22 provided as an anode electrode and a cathode electrode. The first lead frame 21 and the second lead frame 22 may be separated from one another while facing one another.

The plurality of unit frames 20 may be spaced apart from the outer frame 10 by the separating grooves 11 interposed therebetween. At least two adjacent unit frames 20 may form a set to be enclosed by the separating grooves 11. A plurality of sets of the unit frames 20 may be disposed at intervals inside the outer frame 10.

According to the exemplary embodiment, two unit frames 20 may form a set; however, the number of unit frames 20 to be included in the set is not limited thereto. According to exemplary embodiments, two or more unit frames 20 may form a set.

The connector 30 may include a first connector 31 and a second connector 32 forming connections between each of the unit frames 20 and the outer frame 10 with the separating grooves 11 disposed therebetween.

The first connector 31 and the second connector 32 may be disposed on both sides of each unit frame 20 facing one another in the first direction. As illustrated in FIG. 2, the first connector 31 may be disposed on both sides of one pair of unit frames 20 in the first direction to directly connect the corresponding unit frames 20 and the outer frame 10 while being disposed therebetween. The second connector 32 may be disposed between the pair of unit frames 20 to directly connect the corresponding unit frames 20 to one another. Accordingly, the pair of unit frames 20 disposed in the first direction may be connected to the outer frame 10 through the first connector 31, and may be connected to one another through the second connector 32.

A portion of the second connector 32 disposed between the pair of unit frames 20 may further extend in the second direction perpendicular to the first direction so as to be connected to the outer frame 10. Accordingly, sagging of the pair of unit frames 20 in the second connector 32 may be prevented, and mechanically stable support thereof may be achieved.

The plurality of unit frames 20 and the plurality of connectors 30 may be integrated with the outer frame 10. For example, the plurality of unit frames 20 and the plurality of connectors 30 and the outer frame 10 may be formed as one body in the base frame 1 through a punching process.

As illustrated in FIG. 1, the outer frame 10 of the base frame 1 may be further provided with a guide groove 12, corresponding to a position of each unit frames 20. The guide grooves 12 may be formed in the outer frame 10 and may be arranged in the first direction, and may function as a guide for the positions of the unit frames 20 to be arranged.

Figure 3:
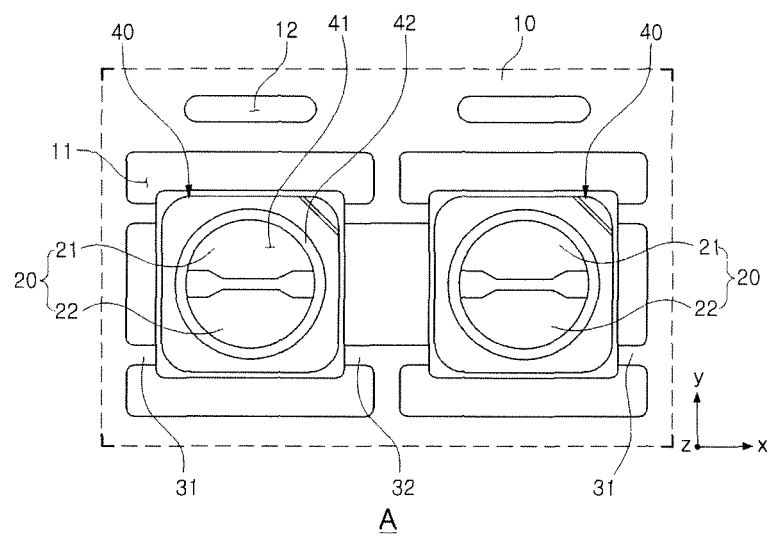
FIG. 3 is a plan view schematically illustrating a process of forming a package body in a unit frame of FIG. 2.

Referring to FIG. 3, in operation S2 of FIG. 8, a package body 40 may be formed in each of the plurality of unit frames 20 to allow a mounting area of each unit frame 20 to be open.

For example, the package body 40 may be formed by injecting and solidifying resins, such as polycarbonate (PC), polymethylmethacrylate (PMMA), acrylic resins, acrylonitrile butadiene styrene (ABS), or the like, or epoxy in a mold. Here, an injection molding scheme, a transfer molding scheme, a compression molding scheme, or the like, may be employed.

The package body 40 may be formed to have a structure enclosing each unit frames 20 along the separating grooves 11. In detail, the package body 40 may have a general package structure provided in a rectangular form, and may have a structure enclosing the first and second lead frames 21 and 22 constituting the unit frame 20 in an integrated manner, that is as one body. Also, the package body 40 may be separated from the outer frame 10 at intervals by the separating grooves 11.

The first and second lead frames 21 and 22 may be externally exposed through a bottom surface of the package body 40. The plurality of connectors 30 connected to both sides of the first lead frame 21 and both sides of the second lead frame 22 may protrude and extend outwardly from both sides of the package body 40 facing one another.

As illustrated in FIG. 3, both sides of the package body 40 may be perpendicular to the first direction. The first connector 31 connected to the first and second lead frames 21 and 22 may protrude from one side of the package body 40 facing the outer frame 10 to be connected to the outer frame 10, and the second connector 32 connected to the first and second lead frames 21 and 22 may protrude from the other side of the package body 40 to be connected to an adjacent unit frame 20.

The package body 40 may be provided with a recess 41 in a form of a reflective cup in a center of a top surface thereof. As illustrated in FIG. 5B, an inner lateral surface 42 of the recess 41 may be tapered in an inclined manner, and may function as a reflective surface. Portions of the first and second lead frames 21 and 22 may be exposed to a bottom surface of the recess 41, and may be defined as the mounting area of the unit frame 20. Accordingly, the bottom surface of the recess 41 may be open as the mounting area of the unit frame 20.

Figure 4:
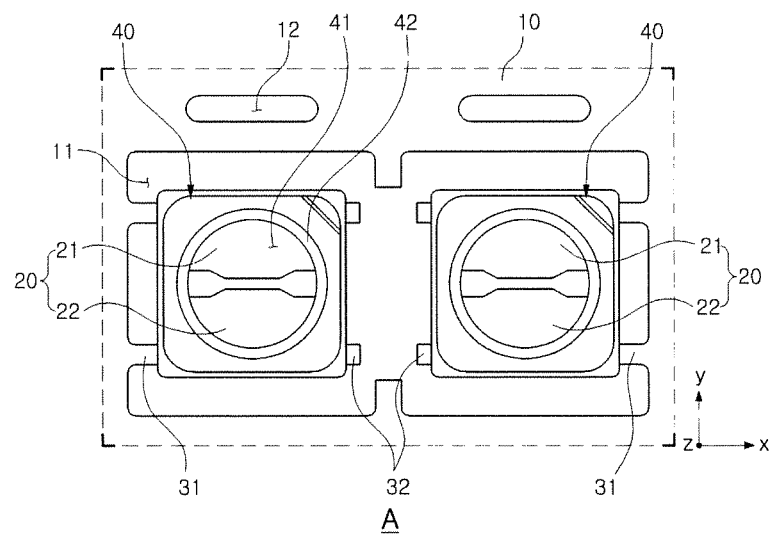
FIG. 4 is a top plan view illustrating a process of removing a connector forming connections between unit frames of FIG. 3.

Referring to FIG. 4, in operation S3 of FIG. 8, one of the first connector 31 and the second connector 32 connected to each unit frame 20 may be removed.

In detail, the connector forming connections between adjacent unit frames 20, of the first connector 31 and the second connector 32 connected to each unit frame 20, may be removed. Accordingly, the removed connector is the second connector 32 disposed between the adjacent unit frames 20.

For example, the second connector 32 may be removed through being cut in a trimming process. In this instance, the second connector 32 may be cut in a state in which the outer frame 10 and the package body 40 are supported on a die (not illustrated).

As such, the effect of impacts applied to the package body 40 and the unit frame 20 may be reduced by cutting the connector on one side of the package body 40, namely, the second connector 32, of the first connector 31 and the second connector 32 supporting the package body 40 on the both sides thereof, along with the unit frame 20, while extending from the both sides of the package body 40. Also, the effect of impacts may be further mitigated since the cutting is performed in the state in which the outer frame 10 and the package body 40 are supported on the die.

The connector on one side of the package body 40, namely, the second connector 32, of the first connector 31 and the second connector 32 supporting the package body 40 on the both sides thereof may be removed, such that the package body 40 may be supported while maintaining a connection with the outer frame 10 only via a single connector, namely, the first connector 31, connected to the other side of the package body 40.

Figure 5A:
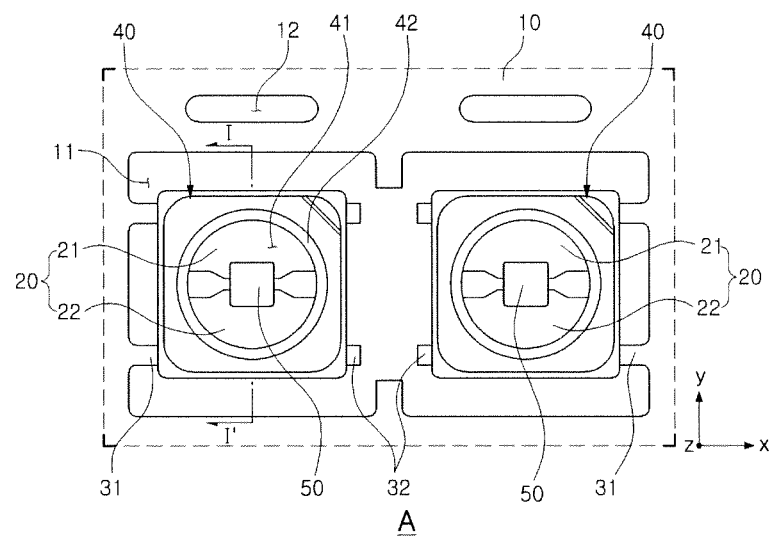
FIG. 5A is a top plan view illustrating a process of mounting a semiconductor device.
Figure 5B:
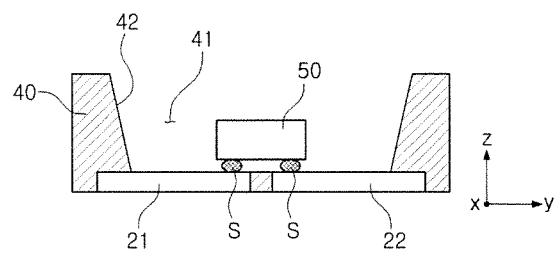
FIG. 5B is a cross-sectional side view of FIG. 5A, taken along line I-I'.

Referring to FIGS. 5A and 5B, in operation S4 of FIG. 8, a semiconductor device 50 may be mounted in the mounting area of the unit frame 20. The semiconductor device 50 may be mounted on the first lead frame 21 and the second lead frame 22 being exposed to the bottom surface of the recess 41.

The semiconductor device 50 may be a photoelectric device generating light having a predetermined wavelength through externally applied driving power. For example, the semiconductor device 50 may be a semiconductor light emitting diode (LED) chip having an n-type semiconductor layer, a p-type semiconductor layer, and an active layer interposed therebetween.

For example, the semiconductor device 50 may be physically and electrically connected to the first and second lead frames 21 and 22 using a solder S in a flip chip bonding manner. However, the bonding manner is not limited thereto, and the semiconductor device 50 may be connected to the first and second lead frames 21 and 22 in a wire bonding manner.

Although a single semiconductor device 50 is mounted in the exemplary embodiment provided herein, the number of semiconductor devices 50 is not limited thereto, and the semiconductor device 50 may include a plurality of semiconductor devices.

Figure 6A:
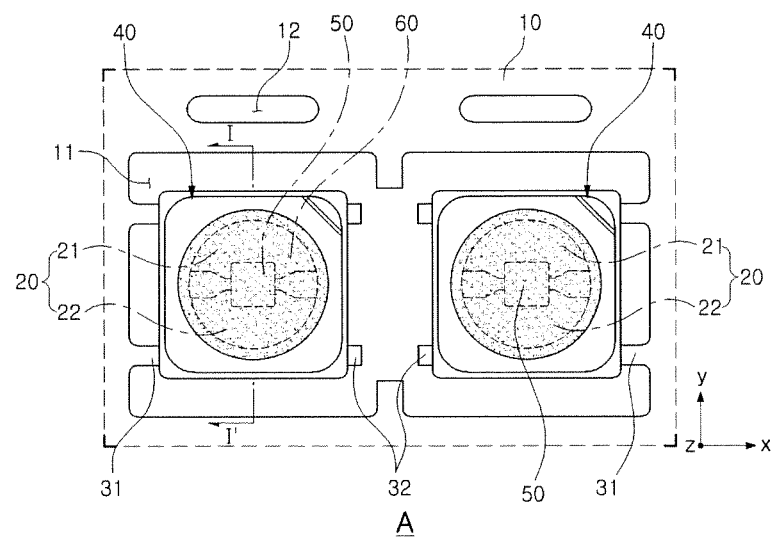
FIG. 6A is a top plan view illustrating a process of forming an encapsulating portion.
Figure 6B:
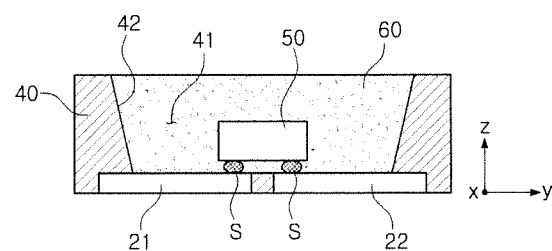
FIG. 6B is a cross-sectional side view of FIG. 6A, taken along line I-I'.

FIGS. 6A and 6B illustrate a process of forming an encapsulating portion 60 to encapsulate the semiconductor device 50 mounted in a mounting area of the package body 40.

The encapsulating portion 60 may be formed of a resin material having light transmissivity, may be formed to fill the recess 41, and may cover and protect the semiconductor device 50. The encapsulating portion 60 may contain a wavelength converting material.

For example, the wavelength converting material may contain at least one type of phosphor excited by light generated by the semiconductor device 50 so as to emit light having a different wavelength. Accordingly, the emission of light having various colors, including white light, may be controlled.

For example, in a case in which the semiconductor device 50 is an LED chip emitting blue light, white light may be emitted through a combination thereof with yellow, green, and red or orange phosphors. Also, the semiconductor device 50 may be configured to include at least one light emitting device emitting purple, blue, green, red, or an infrared (IR) light. In this instance, the semiconductor device 50 may adjust a color rendering index (CRI) in a range from a level of light emitted by a sodium lamp with a CRI of 40, or the like, to a level of sunlight with a CRI of 100, and may generate various types of white light having a color temperature in a range of 2000K to 20000K. Also, the color may be adjusted by generating visible purple, blue, green, red, orange light, or IR light, corresponding to a surrounding atmosphere or desired mood as necessary. Also, light from within a predetermined wavelength known to stimulate plant growth may be generated.

Figure 24:
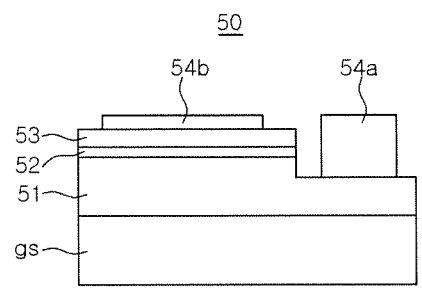
FIGS. 24 through 26 are cross-sectional front elevation views illustrating various examples of a light emitting diode (LED) chip applicable to a semiconductor device according to an exemplary embodiment of the present disclosure.

White light generated by combining yellow, green, red phosphors to a blue LED and/or combining at least one of a green LED and a red LED thereto may have two or more peak wavelengths, and may be positioned on a segment linking (x, y) coordinates of (0.4476, 0.4074), (0.3484, 0.3516), (0.3101, 0.3162), (0.3128, 0.3292), and (0.3333, 0.3333) in the CIE 1931 chromaticity diagram illustrated in FIG. 24. Alternatively, the white light may be positioned in a region surrounded by the segment and a black body radiation spectrum. The color temperature of the white light may be in a range of about 2000K to 20000K.

A phosphor may have a compositional formula and a color as follows.

Oxide-based phosphors: yellow and green $Y_3Al_5O_{12}$:Ce, $Tb_3Al_5O_{12}$:Ce, $Lu_3Al_5O_{12}$:Ce Silicate-based phosphors: yellow and green $(Ba,Sr)_2SiO_4$:Eu, yellow and orange $(Ba,Sr)_3SiO_5$:Ce Nitride-based phosphors: green β-SiAlON:Eu, yellow $La_3Si_6N_{11}$:Ce, orange α-SiAlON:Eu, red $CaAlSiN^3$:Eu, $Sr_2Si_5N_8$:Eu, $SrSiAl_4N_7$:Eu Fluoride-based phosphors: KSF red $K_2SiF_6$:Mn4+

In general, the phosphor composition may meet stoichiometric requirements, and each element may be substituted with a different element within the same group in the periodic table of elements. For example, strontium (Sr) may be substituted with barium (Ba), calcium (Ca), magnesium (Mg) or the like, in the alkaline earth metal group II while yttrium (Y) may be substituted with terbium (Tb), lutetium (Lu), scandium (Sc), gadolinium (Gd), or the like, in the lanthanide group. Also, europium (Eu), or the like, an activator, may be substituted with cerium (Ce), Tb, praseodymium (Pr), erbium (Er), ytterbium (Yb), or the like, based on a desired energy level. In addition, the activator may be used alone, or a co-activator, or the like, may be further included.

Further, a material such as a quantum dot (QD) may be used as a phosphor substitute material, or the phosphor and the QD may be used in combination or alone.

The QD may have a structure including a core such as cadmium selenide (CdSe) and indium phosphide (InP) having a diameter of 3 to 10 nanometers (nm), a shell such as zinc sulfide (ZnS) and zinc selenide (ZnSe) having a thickness of 0.5 to 2 nm, and a ligand for stabilizing the core and shell, and may provide various colors based on the size thereof.

The encapsulating portion 60 may contain a light diffusing material. For example, the light diffusing material may include at least one material selected from group consisting of silicon dioxide ($SiO_2$), titanium oxide ($TiO_2$), and aluminum oxide ($Al_2O_3$). The light diffusing material may be contained in an amount of about 3% to 15% by volume in the encapsulating portion 60. In a case in which the light diffusing material is contained in an amount less than 3% by volume, a reduction in a light diffusing effect may occur due to insufficient light being diffused. In a case in which the light diffusing material is contained in an amount greater than 15% by volume, a decrease in light extraction efficiency may occur due to a reduction in an amount of light emitted externally through the encapsulating portion 60.

Figure 7:
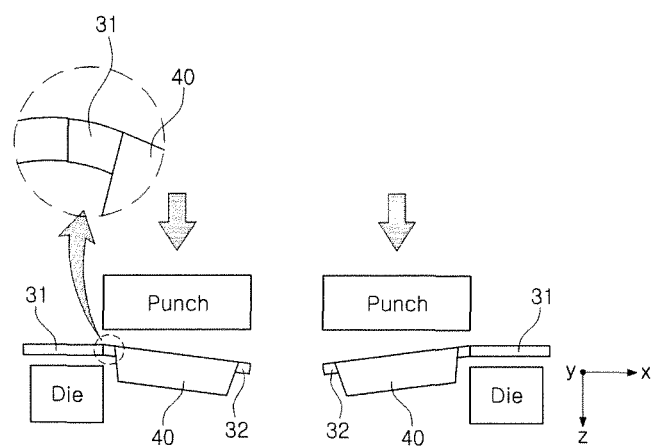
FIG. 7 is a front elevation view illustrating a process of cutting a connector forming connections between a unit frame and an outer frame.

Referring to FIG. 7, in operation S5 of FIG. 8, the remaining connector of the first connector 31 and the second connector 32 connected to each unit frame 20 may be cut, and the unit frame 20 in which the package body 40 is formed may be separated from the base frame 1.

The remaining connector being cut of the first connector 31 and the second connector 32 may be the first connector 31 supporting the unit frame 20 to maintain a connection between the unit frame 20 and the outer frame 10 through the second connector 32 connecting the pair of adjacent unit frames 20 therebetween being removed.

Figure 16:
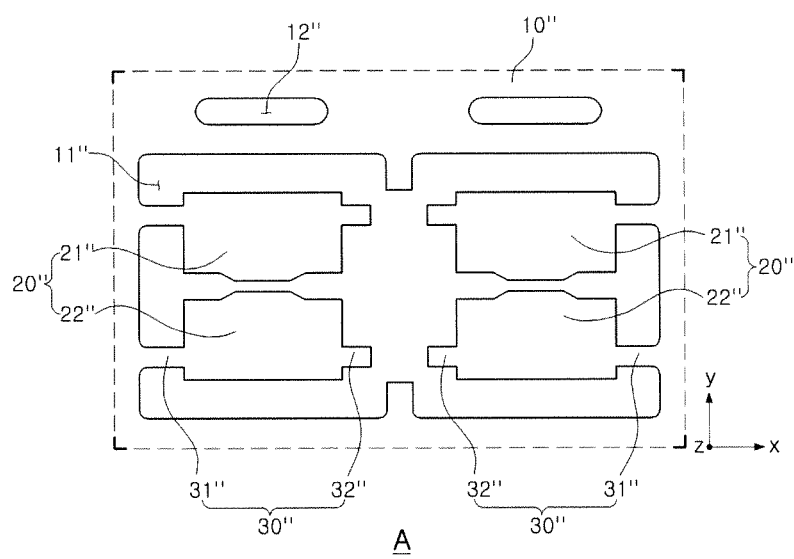
FIG. 16 is a top plan view illustrating a process of removing a connector forming connections between unit frames.

For example, the first connector 31 may be cut by a trimming process. In this instance, the first connector 31 may be cut in the state in which the outer frame 10 is supported on the die. As illustrated in FIG. 16, a semiconductor device package 100 (see FIG. 22A) being separated from the base frame 1 may be mass produced.

Referring to FIGS. 9 through 14, a method of manufacturing a semiconductor device package according to another exemplary embodiment of the present disclosure will be described.

Figure 9:
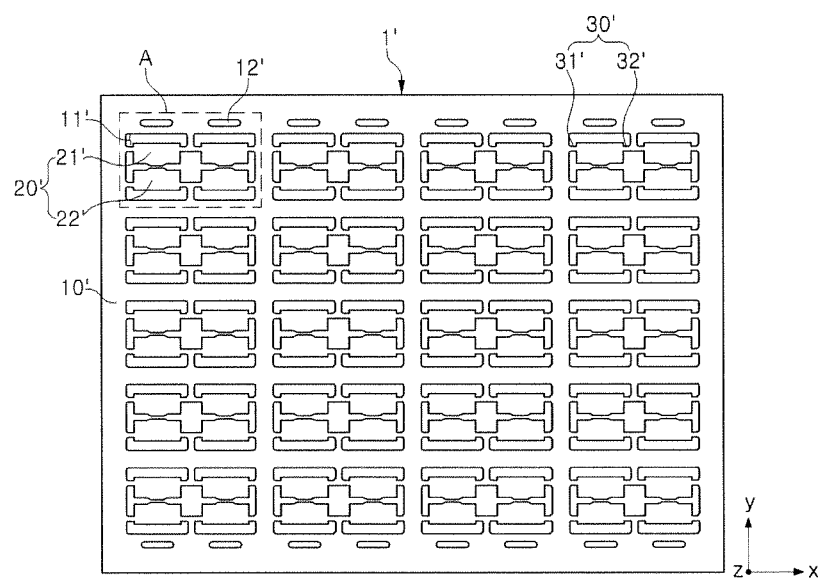
FIG. 9 is a top plan view illustrating a base frame used in a method of manufacturing a semiconductor device package according to another exemplary embodiment of the present disclosure.
Figure 14:
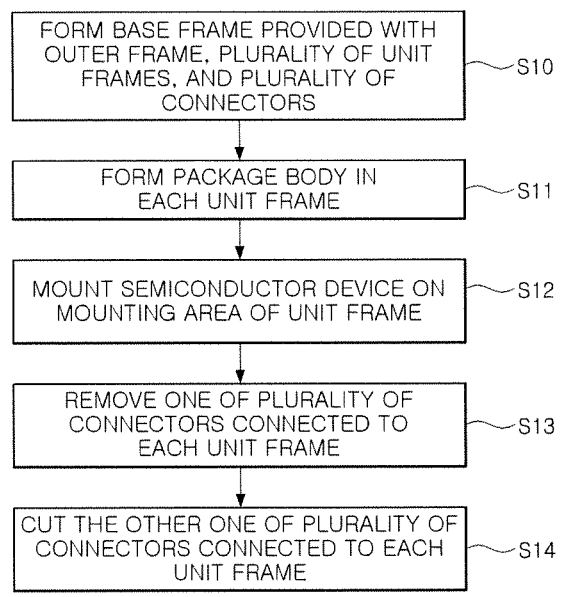
FIG. 14 is a flowchart schematically illustrating a method of manufacturing a semiconductor device package according to another exemplary embodiment of the present disclosure.

As illustrated in FIGS. 9 and 14, in operation S10 of FIG. 14, a base frame 1' may be formed to include an outer frame 10', a plurality of unit frames 20' spaced apart from the outer frame 10' by separating grooves 11' interposed therebetween, and a plurality of connectors 30' forming connections between each of the plurality of unit frames 20' and the outer frame 10'.

The base frame 1' according to the exemplary embodiment illustrated in FIG. 9 may be the same as the base frame 1 illustrated in FIG. 1. That is, the outer frame 10', the guide grooves 12', the plurality of unit frames 20', and the plurality of connectors 30' provided in the base frame 1' may correspond to the outer frame 10, the guide grooves 12, the plurality of unit frames 20, and the plurality of connectors 30, respectively. Accordingly, detailed descriptions pertaining thereto will be omitted.

Figure 10:
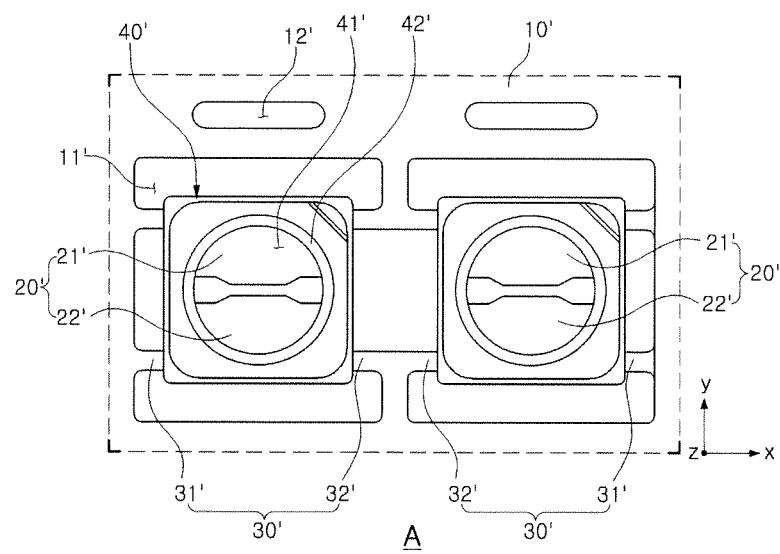
FIG. 10 is a top plan view illustrating a process of forming a package body in a unit frame of FIG. 9.

Referring to FIG. 10, in operation S11 of FIG. 14, a package body 40' may be formed in each of the plurality of unit frames 20' to allow a mounting area of each unit frame 20' to be open.

The package body 40' may be formed to have a structure enclosing each unit frame 20' along the separating grooves 11'. The package body 40' may be provided with a recess 41' in a form of a reflective cup in a center of the top surface thereof.

An inner lateral surface 42' of the recess 41' may be tapered in an inclined manner, and may function as a reflective surface. Portions of first and second lead frames 21' and 22' constituting the unit frame 20' may be exposed to a bottom surface of the recess 41', and may be defined as the mounting area of the unit frame 20'. Accordingly, the bottom surface of the recess 41' may be open as the mounting area of the unit frame 20'.

Figure 11:
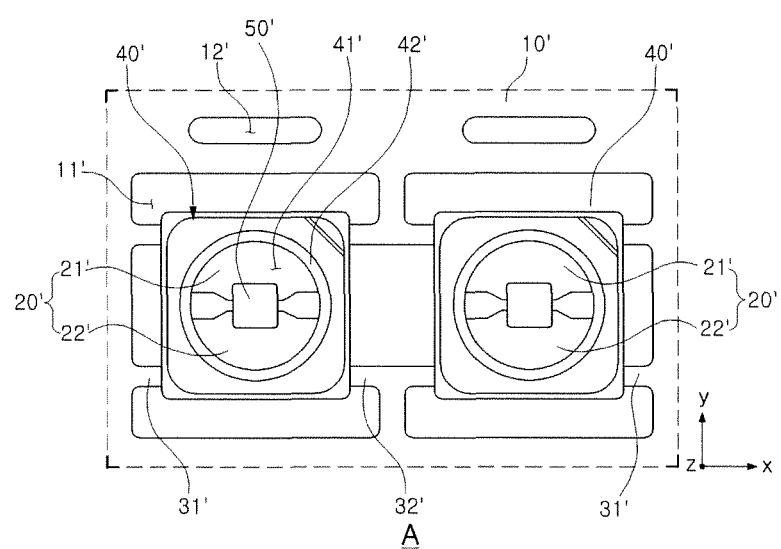
FIG. 11 is a top plan view y illustrating a process of mounting a semiconductor device.

As illustrated in FIG. 11, the first connector 31' and the second connector 32' each connected to the first and second lead frames 21' and 22' may protrude from both sides of the package body 40', so as to be connected to the outer frame 10' and an adjacent unit frame 20'.

Since the package body 40' and a process of forming the package body 40' correspond to the package body 40 and the process of forming the same illustrated in FIG. 3, respectively, repeated descriptions will be omitted herein for conciseness.

Referring to FIG. 11, in operation S12 of FIG. 14, a semiconductor device 50' may be mounted in the mounting area of the unit frame 20'. The semiconductor device 50' may be mounted in the mounting area of the unit frame 20' exposed through the recess 41', in other words, may be mounted on the first lead frame 21' and the second lead frame 22' being exposed to the bottom surface of the recess 41'.

A process of forming an encapsulating portion 60' filling the recess 41' to encapsulate the semiconductor device 50' may be performed.

Figure 12:
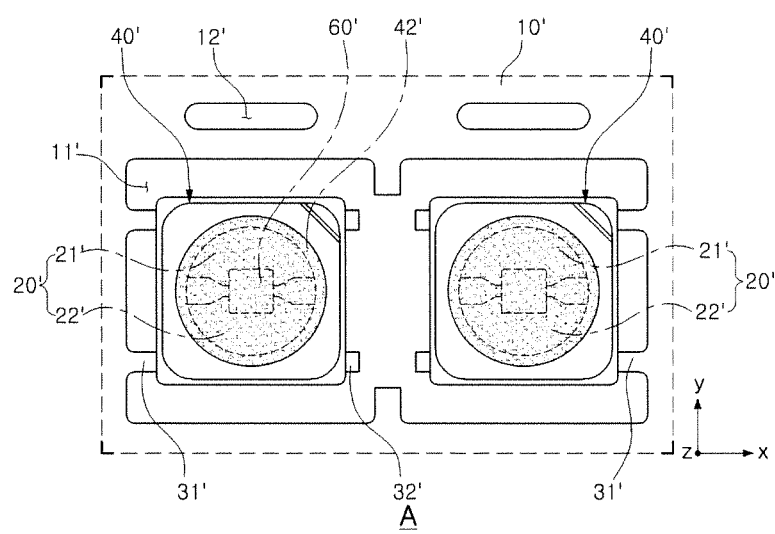
FIG. 12 is a top plan view illustrating a process of removing a connector forming connections between unit frames.

Referring to FIG. 12, in operation S13 of FIG. 14, one of the first connector 31' and the second connector 32' connected to each unit frame 20' may be removed.

The connector being removed may be the second connector 32' disposed between at least one pair of adjacent unit frames 20'. For example, the second connector 32' may be removed by a trimming process. In this instance, the second connector 32' may be cut in a state in which the outer frame 10' and the package body 40' are supported on a die (not illustrated).

As such, the connector on one side of the package body 40', namely, the second connector 32', of the first connector 31' and the second connector 32' supporting the package body 40' along with the unit frame 20' on the both sides thereof may be removed, such that the unit frame 20' in which the package body 40' is formed may be supported while maintaining a connection with the outer frame 10' only via a single connector, namely, the first connector 31', connected to the other side of the package body 40'.

Figure 13:
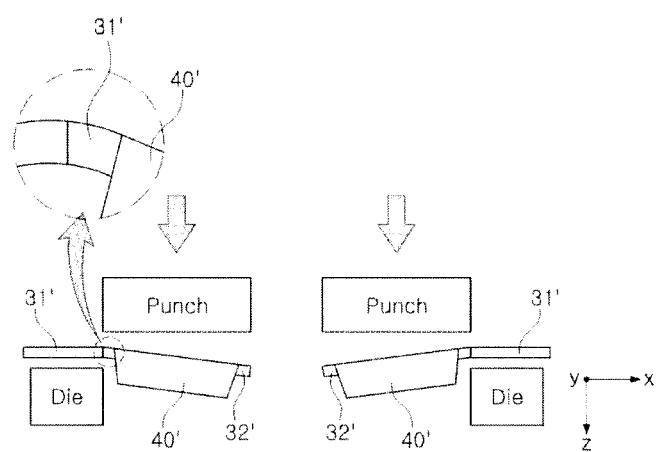
FIG. 13 is a front elevation view illustrating a process of cutting a connector forming connections between a unit frame and an outer frame.

Referring to FIG. 13, operation S14 of FIG. 14, the remaining connector of the first connector 31' and the second connector 32' connected to each unit frame 20' may be cut, and the unit frame 20' in which the package body 40' is formed may be separated from the base frame 1'.

The remaining connector being cut may be the first connector 31' supporting the unit frame 20' to maintain a connection between the unit frame 20' and the outer frame 10' through the second connector 32' connecting the at least one pair of adjacent unit frames 20' therebetween being removed.

For example, the first connector 31' may be cut by a trimming process. In this instance, the first connector 31' may be cut in the state in which the outer frame 10' is supported on the die.

Referring to FIGS. 15 through 21, a method of manufacturing a semiconductor device package according to another exemplary embodiment of the present disclosure will be described.

Figure 15:
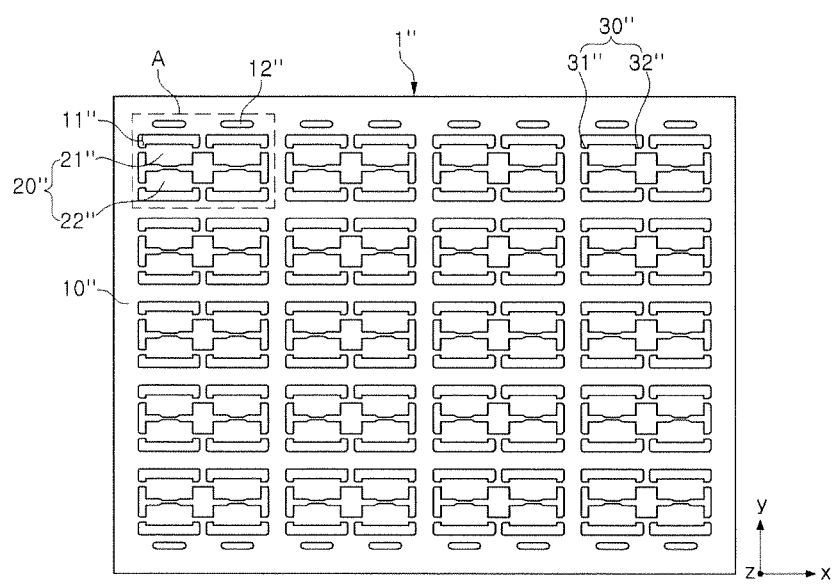
FIG. 15 is a top plan view illustrating a base frame used in a method of manufacturing a semiconductor device package according to another exemplary embodiment of the present disclosure.
Figure 21:
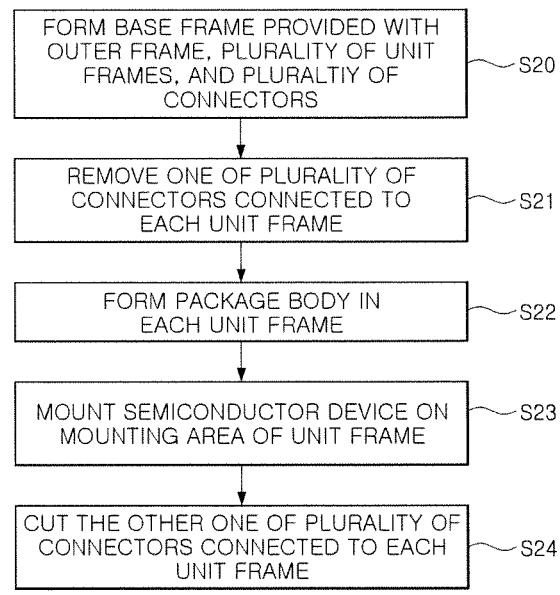
FIG. 21 is a flowchart illustrating a method of manufacturing a semiconductor device package according to another exemplary embodiment of the present disclosure.

As illustrated in FIGS. 15 and 21, in operation S20 of FIG. 21, a base frame 1" may be formed to include an outer frame 10", a plurality of unit frames 20" spaced apart from the outer framed 10" by separating grooves 11" interposed therebetween, and a plurality of connectors 30" forming connections between each of the plurality of unit frames 20" and the outer frame 10".

The base frame 1" according to the exemplary embodiment illustrated in FIG. 15 may be the same as the base frame 1 illustrated in FIG. 1. That is, the outer frame 10", the guide grooves 12", the plurality of unit frames 20", and the plurality of connectors 30" provided in the base frame 1" may correspond to the outer frame 10, the guide grooves 12, the plurality of unit frames 20, and the plurality of connectors 30, respectively. Accordingly, detailed descriptions pertaining thereto will be omitted.

Referring to FIG. 16, in operation S21 of FIG. 21, one of the first connector 31" and the second connector 32" connected to each unit frame 20" may be removed.

The connector being removed may be the second connector 32" disposed between at least one pair of adjacent unit frames 20". For example, the second connector 32" may be removed by a trimming process. In this instance, the second connector 32" may be cut in a state in which the outer frame 10" is supported on a die (not illustrated).

As such, the connector on one side of the unit frame 20", namely, the second connector 32", of the first connector 31" and the second connector 32" supporting the unit frame 20" on both sides thereof may be removed, such that the unit frame 20" may be supported while maintaining a connection with the outer frame 10" only via a single connector, namely, the first connector 31", connected to the other side of the unit frame 20".

Figure 17:
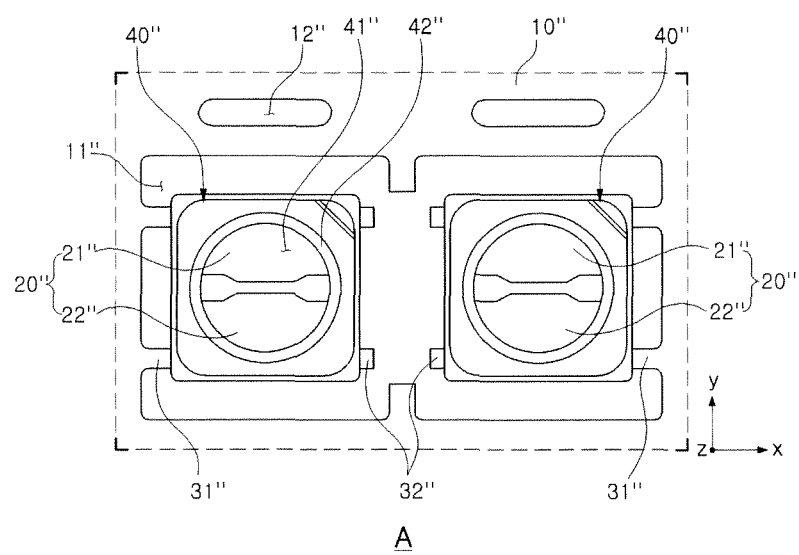
FIG. 17 is a top plan view illustrating a process of forming a package body in a unit frame of FIG. 16.

Referring to FIG. 17, in operation S22 of FIG. 21, a package body 40" may be formed in each of the plurality of unit frames 20" to allow a mounting area of each unit frame 20" to be open.

The package body 40" may be formed to have a structure enclosing each unit frame 20" along the separating grooves 11". The package body 40" may be provided with a recess 41" in a form of a reflective cup in a center of a top surface thereof.

An inner lateral surface 42" of the recess 41" may be tapered in an inclined manner, and may function as a reflective surface. Portions of the first and second lead frames 21" and 22" constituting the unit frame 20" may be exposed to a bottom surface of the recess 41", and may be defined as the mounting area of the unit frame 20". Accordingly, the bottom surface of the recess 41" may be open as the mounting area of the unit frame 20".

As illustrated in FIG. 17, the first connector 31" and the second connector 32" each connected to the first and second lead frames 21" and 22" may protrude from both sides of the package body 40", so as to be connected to the outer frame 10" and an adjacent unit frame 20".

Since the package body 40" and a process of forming the same correspond to the package body 40 and the process of forming the same illustrated in FIG. 3, respectively, repeated descriptions will be omitted here for conciseness.

Figure 18:
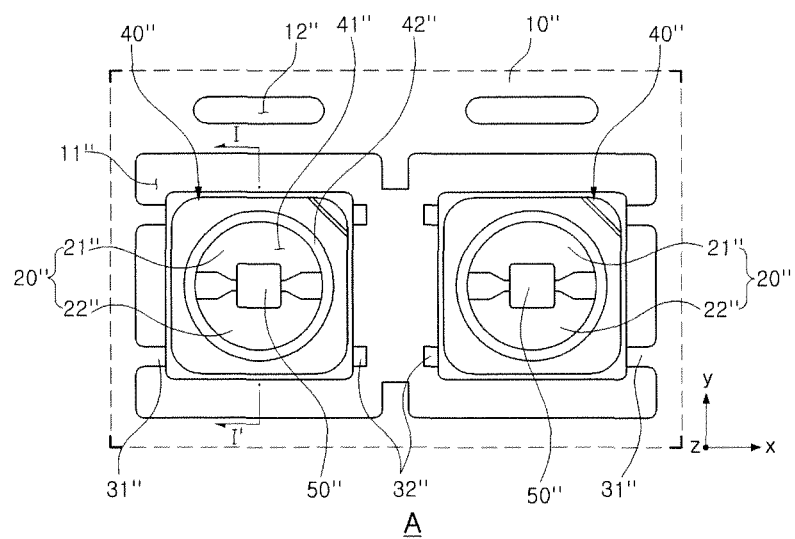
FIG. 18 is a top plan view illustrating a process of mounting a semiconductor device.

Referring to FIG. 18, in operation S23 of FIG. 21, a semiconductor device 50" may be mounted in the mounting area of the unit frame 20". The semiconductor device 50" may be mounted in the mounting area of the unit frame 20" exposed through the recess 41", in other words, may be mounted on the first lead frame 21" and the second lead frame 22" being exposed to the bottom surface of the recess 41".

Figure 19:
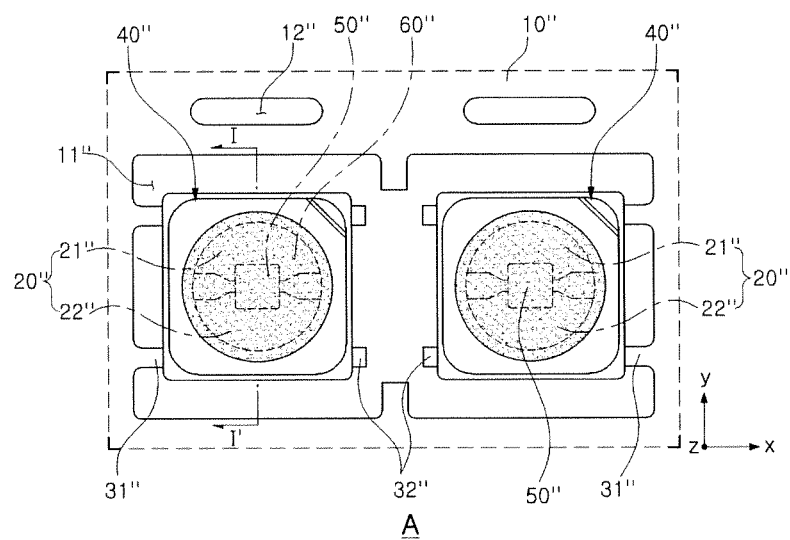
FIG. 19 is a top plan view illustrating a process of forming an encapsulating portion.

FIG. 19 illustrates a process of forming an encapsulating portion 60" in the package body 40" to encapsulate the semiconductor device 50" mounted in the mounting area.

The encapsulating portion 60" may be formed of a resin material having light transmissivity, may be formed to fill the recess 41", and may encapsulate and protect the semiconductor device 50". The encapsulating portion 60" may contain a wavelength converting material.

For example, the wavelength converting material may contain at least one type of phosphor excited by light generated by the semiconductor device 50"so as to emit light having a different wavelength. Accordingly, the emission of light having various colors, including white light, may be controlled.

Figure 20:
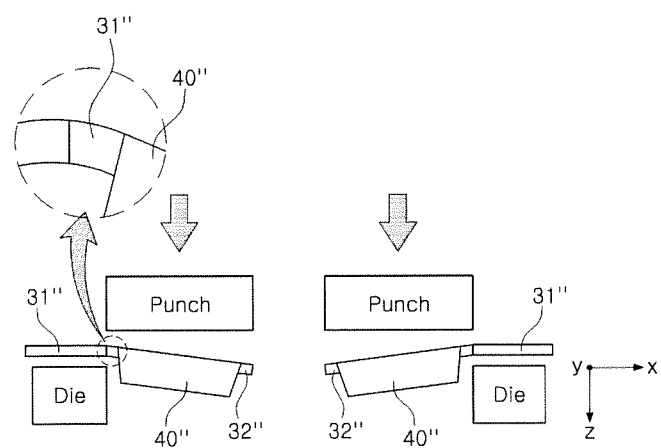
FIG. 20 is a front elevation view illustrating a process of cutting a connector forming connections between a unit frame and an outer frame.

Referring to FIG. 20, in operation S24 of FIG. 21, the remaining connector of the first connectors 31" and the second connector 32" connected to each unit frame 20" may be cut, and the unit frame 20" in which the package body 40" is formed may be separated from the base frame 1".

The remaining connector being cut may be the first connector 31" supporting the unit frame 20" to maintain a connection between the unit frame 20" and the outer frame 10" through the second connector 32" connecting the at least one pair of adjacent unit frames 20" therebetween being removed.

For example, the first connector 31" may be cut by a trimming process. In this instance, the first connector 31" may be cut in a state in which the outer frame 10" is supported on the die.

As such, a cutting process performed to remove the second connector 32" may be omitted from the process of manufacturing the semiconductor device package in a case in which the base frame 1" is formed in a state in which the second connector 32" of the first connector 31" and the second connector 32" supporting the unit frame 20" is initially removed. Accordingly, the trimming process for cutting the first connector 31" may be performed once, and thus impacts applied to the semiconductor device 50" may be minimized.

In the process of separating the manufactured semiconductor device package 100 from the base frame 1, the method of manufacturing the semiconductor device package according to the exemplary embodiment may differ from the conventional method, namely, a full trimming scheme, including simultaneous cutting of the plurality of connectors 30 supporting the lead frame on both sides thereof in which the package body 40 is formed, by the trimming process. On the other hand, the method of manufacturing the semiconductor device package according to the exemplary embodiment may employ a half trimming scheme including cutting and separating the connector on one side of the lead frame, for example, the second connector, and cutting and separating the remaining connector, for example, the first connector, in a final process in a state in which the second connector is cut and removed.

As in the conventional method, when the lead frame is cut by the trimming process while being connected on the both sides thereof, the lead frame on which the semiconductor device is mounted may be instantly transformed by a bending moment caused by a die and a punch. During the cutting, the bending moment may be transferred to an interior of the package, thereby applying stress to the solder connecting the lead frame and the semiconductor device, and applying impacts thereto. Further, due to the internal impact, the semiconductor device may be separated or damaged. In addition, the package body enclosing the lead frame may also be damaged.

However, according to the exemplary embodiment, in a case in which the connector on one side of the lead frames, for example, the second connector, is cut in advance, and the trimming process is subsequently performed with respect to the remaining connector on the other side of the lead frame, for example, the first connector, the bending moment may not occur in the lead frame being cut in advance, for example, the second connector, based on a condition of a free end thereof, and deformation of the remaining lead frame, that is, the first connector, during the cutting thereof may occur only in a minimal portion thereof. Accordingly, stress to the package body or deformation thereof in which the semiconductor device is present may be substantially minimized. Accordingly, product defects caused by damage may be avoided since the impacts applied to the package body rarely occur during the trimming process.

According to analysis results of applying the finite element method (FEM) to stress distribution based on the conventional full trimming scheme and the half trimming scheme according to the exemplary embodiment, in the conventional full trimming scheme, stress is about 0.135 megapascals (MPa), while based on the half trimming scheme, stress is about 6.85 e-5 MPa. That is, in a case of the half trimming scheme according to the exemplary embodiment, deformation of the package body may be substantially minimized, and stress applied to a solder surface may be reduced by 1/5000 as compared to conventional schemes.

Figure 22A:
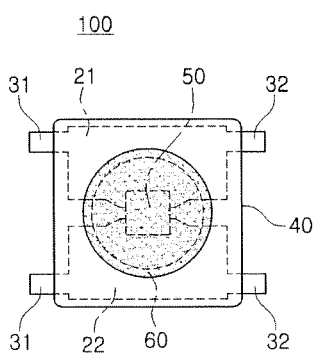
FIGS. 22A and 22B are a top plan view and a side view, respectively, illustrating a semiconductor device package according to an exemplary embodiment of the present disclosure.
Figure 22B:
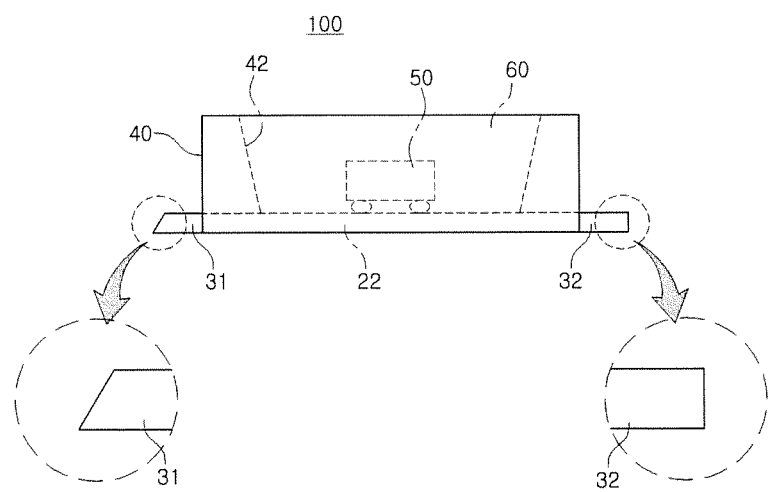
Figure 23:
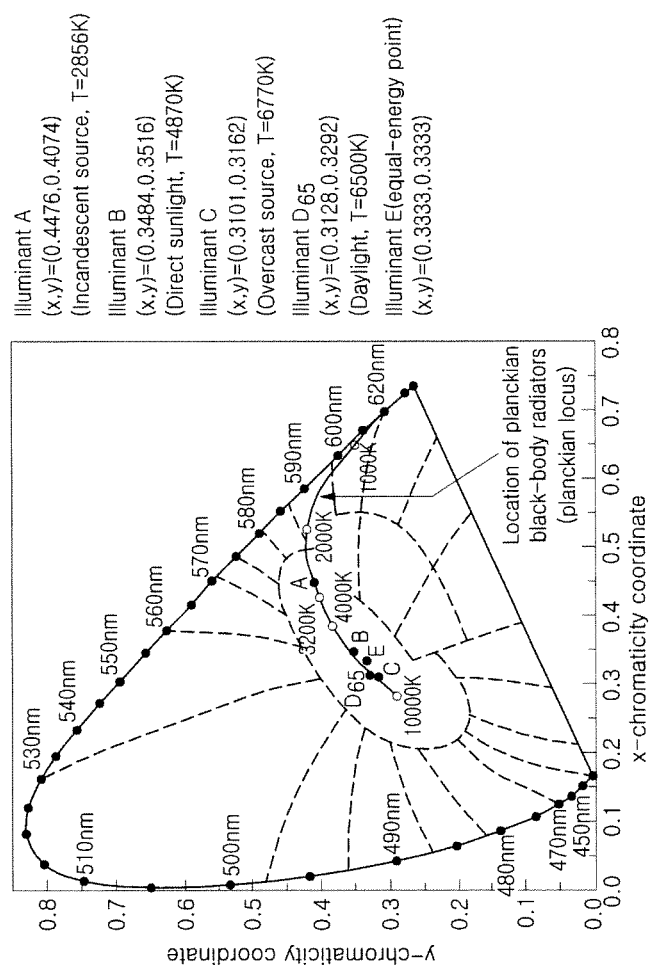
FIG. 23 is a diagram illustrating the CIE 1931 coordinate system.

FIGS. 22A and 22B schematically illustrate the semiconductor device package 100 manufactured using the method of manufacturing the semiconductor device package according to the above-described exemplary embodiment.

The semiconductor device package 100 manufactured using the method of manufacturing the semiconductor device package according to the above-described exemplary embodiment may include the package body 40 functioning as a case, the first and second lead frames 21 and 22 embedded in the package body 40 and fixed thereto, the semiconductor device 50 accommodated in the recess 41 of the package body 40 and physically or electrically connected to the first and second lead frames 21 and 22, and the encapsulating portion 60 filling the recess 41.

The first and second lead frames 21 and 22 may be fixed in parallel to the package body 40 while being embedded in the package body 40. Portions of the first and second lead frames 21 and 22 may be exposed to the recess 41 of the package body 40, and may be externally exposed to the bottom surface of the package body 40.

The first connectors 31 and the second connector 32 each connected to and extending from the both sides of the lead frames 21 and 22 may protrude outwardly from the both sides of the package body 40 facing one another. Here, a cut end surface of the second connector 32 may be substantially vertical, while a cut end surface of the first connector 31 may be inclined. That is, as illustrated in FIG. 7, since the connector on one side of the lead frame, for example, the first connector, is cut in a final separating process, the connector may not be perpendicularly cut, but cut in an inclined manner while being elongated by a punch. Accordingly, the semiconductor device package manufactured using the method of manufacturing the semiconductor device according to the exemplary embodiment may differ from that manufactured using the conventional method, in that one of the first and second connectors has an inclined end surface after being cut.

Figure 25:
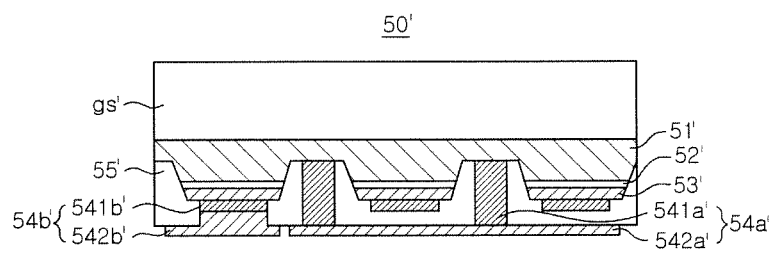
Figure 26:
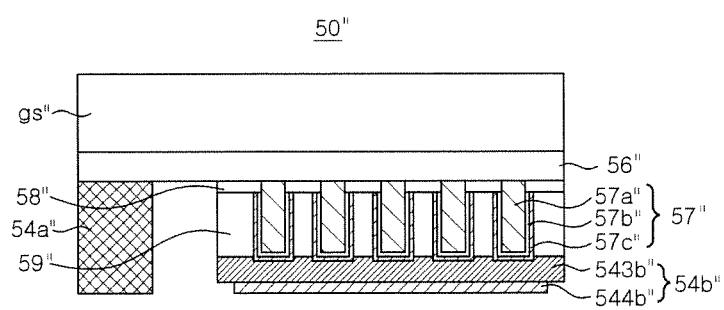

FIGS. 24 through 26 illustrate various examples of an LED chip applicable to a semiconductor device. FIGS. 24 and 26 are cross-sectional views illustrating various examples of an LED chip applicable to the semiconductor device according to the exemplary embodiment.

Referring to FIG. 24, an LED chip 50 may include a first conductivity type semiconductor layer 51, an active layer 52, and a second conductivity type semiconductor layer 53 sequentially stacked on a growth substrate gs.

The first conductivity type semiconductor 51 stacked on the growth substrate gs may be an n-type nitride semiconductor layer doped with n-type impurities. The second conductivity type semiconductor 53 may be a p-type nitride semiconductor layer doped with p-type impurities. However, according to exemplary embodiments, the first and second conductivity type semiconductor layers 51 and 53 may be stacked in different sequences. The first and second conductivity type semiconductor layers 51 and 53 may have a compositional formula of $Al_xIn_yGa_{(1-x-y)}N$, wherein $0 \le x < 1$, $0 \le y < 1$, $0 \le x+y < 1$, and may be a material, for example, GaN, AlGaN, InGaN, and AlInGaN.

The active layer 52 interposed between the first and second conductivity type semiconductor layers 51 and 53 may emit light having a predetermined level of energy generated by a recombination of an electron and a hole. The active layer 52 may include a material having an energy band gap smaller than energy band gaps of the first and second conductivity type semiconductor layers 51 and 53. For example, in a case in which the first and second conductivity type semiconductor layers 51 and 53 are GaN-based compound semiconductors, the active layer 52 may include an InGaN-based compound semiconductor having an energy band gap smaller than an energy band gap of GaN. Also, the active layer 52 may have a multiple quantum well (MQW) structure, for example, an InGaN/GaN structure, in which a quantum well layer and a quantum barrier layer are stacked in an alternating manner. However, the structure of the active layer 52 is not limited thereto, and a single quantum well (SQW) structure may also be used.

The LED chip 50 may include first and second electrode pads 54a and 54b electrically connected to the first and second conductivity type semiconductor layers 51 and 53, respectively. The first and second electrode pads 54a and 54b may be disposed and exposed to face in the same direction. In addition, the first and second electrode pads 54a and 54b may be electrically connected to the unit frame 20 in a wire bonding manner or a flip chip bonding manner.

An LED chip 50' illustrated in FIG. 25 may include a semiconductor laminate formed on a growth substrate gs'. The semiconductor laminate may include a first conductivity type semiconductor layer 51', an active layer 52', and a second conductivity type semiconductor layer 53'.

The LED chip 50' may include first and second electrode pads 54a' and 54b' electrically connected to the first and second conductivity type semiconductor layers 51' and 53', respectively. The first electrode pad 54a' may include a conductive via 541a' penetrating through the second conductivity type semiconductor 53' and the active layer 52' to be connected to the first conductivity type semiconductor layer 51', and an electrode extension portion 542a' connected to the conductive via 541a'. The conductive via 541a' may be enclosed by an insulating layer 55' to be electrically isolated from the active layer 52' and the second conductivity type semiconductor layer 53'. The conductive via 541a' may be disposed in an etched region of the semiconductor laminate. The number, shape, and pitch of the conductive via 541a', a contact area of the conductive via 541a' with the first conductivity type semiconductor layer 51a', or the like, may be designed in order to reduce a contact resistance level, as necessary. Also, the conductive via 541a' may be disposed in an array of rows and columns on the semiconductor laminate to improve current flow. The second electrode pad 54b' may include an ohmic contact layer 541b' and an electrode extension portion 542b' on the second conductivity type semiconductor layer 53'.

An LED chip 50" illustrated in FIG. 26 may include a growth substrate gs", a first conductivity type semiconductor base layer 56" formed on the growth substrate gs", and a plurality of light emitting nanostructures 57" formed on the first conductivity type semiconductor base layer 56". The LED chip 50" may further include an insulating layer 58" and a filling portion 59".

The light emitting nanostructure 57" may include a first conductivity type semiconductor core 57a", an active layer 57b" and a second conductivity type semiconductor layer 57c" sequentially formed as shell layers on a surface of the first conductivity type semiconductor core 57a".

According to the exemplary embodiment, the light emitting nanostructure 57" may be provided as a core-shell structure; however, the type of the light emitting nanostructure 57" is not limited thereto, and may have a different structure, such as a pyramid structure. The first conductivity type semiconductor base layer 56" may be a layer providing a growth surface of the light emitting nanostructure 57". The insulating layer 58" may provide an open area for growth of the light emitting nanostructure 57", and may be a dielectric material, such as $SiO_2$ or silicon nitride ($SiN_x$). The filling portion 59" may structurally stabilize the light emitting nanostructure 57", and may transmit or reflect light. In a manner dissimilar thereto, in a case in which the filling portion 59" includes a light transmitting material, the filling portion 59" may be formed of a transparent material, such as $SiO_2$, $SiN_x$, an elastic resin, silicone, an epoxy resin, a polymer, or plastic. As necessary, in a case in which the filling portion 59" includes a reflective material, the filling portion 59" may be formed of a polymer material such as polyphthalamide (PPA), and metal powder particles or ceramic powder particles having high reflectivity. The ceramic powder particles having high reflectivity may be at least one selected from a group consisting of $TiO_2$, $Al_2O_3$, niobium oxide ($Nb_2O_5$), $Al_2O_3$, and zinc oxide (ZnO). In a manner dissimilar thereto, a metal having high reflectivity may be used, such as Al or Ag.

First and second electrode pads 54a" and 54b" may be disposed on a lower surface of the light emitting nanostructure 57". The first electrode pads 54a" may be disposed on an exposed surface of the first conductivity type semiconductor base layer 56". The second electrode pads 54b" may include an ohmic contact layer 543b" and an electrode extension portion 544b" formed below the light emitting nanostructure 57" and the filling portion 59". In a manner different thereto, the ohmic contact layer 543b" and the electrode extension portion 544b" may be integrally formed.

Figure 27:
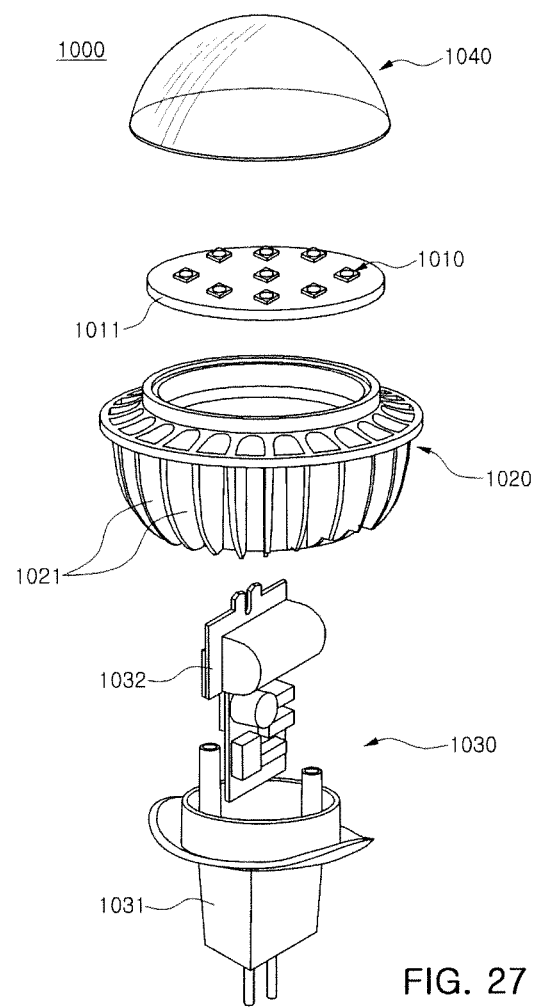
FIG. 27 is an exploded perspective view illustrating a bulb-type lighting apparatus according to an exemplary embodiment of the present disclosure.

FIG. 27 schematically illustrates a bulb-type lighting apparatus according to an exemplary embodiment of the present disclosure.

Referring to FIG. 27, a lighting apparatus 1000 according to an exemplary embodiment of the present disclosure may be a bulb-type lamp, and may be used as an indoor lighting, for example, a downlight. The light apparatus 1000 may include a housing 1020 having an electrical connection structure 1030, and one or more light emitting devices 1010 installed in the housing 1020. The light apparatus 1000 may further include a cover 1040 installed in the housing 1020 and encapsulating the one or more light emitting devices 1010.

The one or more light emitting devices 1010 may be the semiconductor device package 100 of FIG. 22 and thus, detailed descriptions pertaining thereto will be omitted. The one or more light emitting devices 1010 may be mounted on a circuit substrate 1011. The number of the light emitting devices 1010 may be adjusted in various manners as necessary.

The housing 1020 may function as a frame supporting the one or more light emitting devices 1010, and as a heat sink externally dissipating heat generated by the light emitting devices 1010. To this end, the housing 1020 may be formed of a rigid material having high thermal conductivity, for example, a metal material, such as Al or a heat dissipating resin.

A plurality of heat dissipating fins 1021 for increasing a contact area with air to enhance heat dissipating efficiency may be provided on an external lateral surface of the housing 1020.

The electrical connection structure 1030 electrically connected to the light emitting device 1010 may be provided in the housing 1020. The electrical connection structure 1030 may include a terminal 1031, and a driver 1032 supplying driving power to the light emitting device 1010 through the terminal 1031.

The terminal 1031 of the lighting apparatus 1000 may be fixed and electrically connected to a socket, or the like, so as to be installed therein. According to the exemplary embodiment, the terminal 1031 may have a pin-type structure slidingly inserted into the socket; however, the type of the terminal 1031 is not limited thereto. As necessary, the terminal 1031 may have an Edison-type structure having screw threads screwed into the socket.

The driver 1032 may convert external driving power to an appropriate current source for driving the light emitting device 1010, and supply the converted current source. The driver 1032 may be provided with, for example, an alternating current-direct current (AC-DC) converter, components for a rectifier circuit, and a fuse. Also, the driver 1032 may further include a communications module allowing for remote control, according to cases.

The cover 1040 may be installed in the housing 1020 to encapsulate the one or more light emitting devices 1010, and may have a convex lens shape or a bulb shape. The cover 1040 may be formed of a light transmitting material, and contain a light diffusing material.

Figure 28:
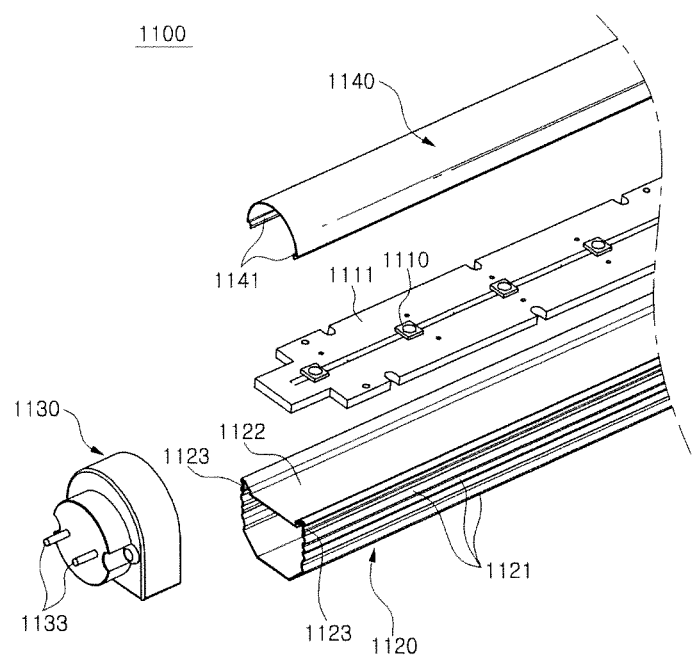
FIG. 28 is an exploded perspective view illustrating an L-type lighting apparatus according to an exemplary embodiment of the present disclosure.

FIG. 28 is an exploded perspective view schematically illustrating a lighting apparatus according to an exemplary embodiment of the present disclosure. Referring to FIG. 28, a lighting apparatus 1100 may be a bar-type lamp by way of example, and may include a light emitting device 1110, a housing 1120, a terminal 1130, and a cover 1140.

The light emitting device 1110 may be the semiconductor device package of FIG. 22 and thus, detailed descriptions pertaining thereto will be omitted. The light emitting device 1110 may include a plurality of light emitting devices and the plurality of light emitting devices 1110 may be mounted on a circuit substrate 1111. The number of light emitting devices 1110 to be mounted on the circuit substrate 1111 may be adjusted in various manners as necessary.

The light emitting device 1110 may be mounted on and fixed to one surface 1122 of the housing, and may externally dissipate heat generated from the light emitting device 1110. To this end, the housing 1120 may be formed of a material having high thermal conductivity, for example, a metal material. A plurality of heat dissipating fins 1121 used for dissipating heat may be provided on both lateral surfaces of the housing 1120 while protruding therefrom.

The plurality of light emitting devices 1110 may be arranged on one surface 1122 of the housing 1120 while being mounted on the circuit substrate 1111.

The cover 1140 may be fastened to a fastening groove 1123 of the housing 1120 so as to encapsulate the light emitting device 1110. The cover 1140 may have a semicircular curved surface to allow light generated from the light emitting device 1110 to be uniformly dissipated externally. A protrusion portion 1141 engaged with the fastening groove 1123 of the housing 1120 may be formed on a bottom surface of the cover 1140 in a lengthwise direction of the housing 1120.

The terminal 1130 may be provided in an open end portion of the housing 1120 in the lengthwise direction thereof, and supply power to the light emitting device 1110. The terminal 1130 may include an outwardly protruding electrode pin (1133).

Figure 29:
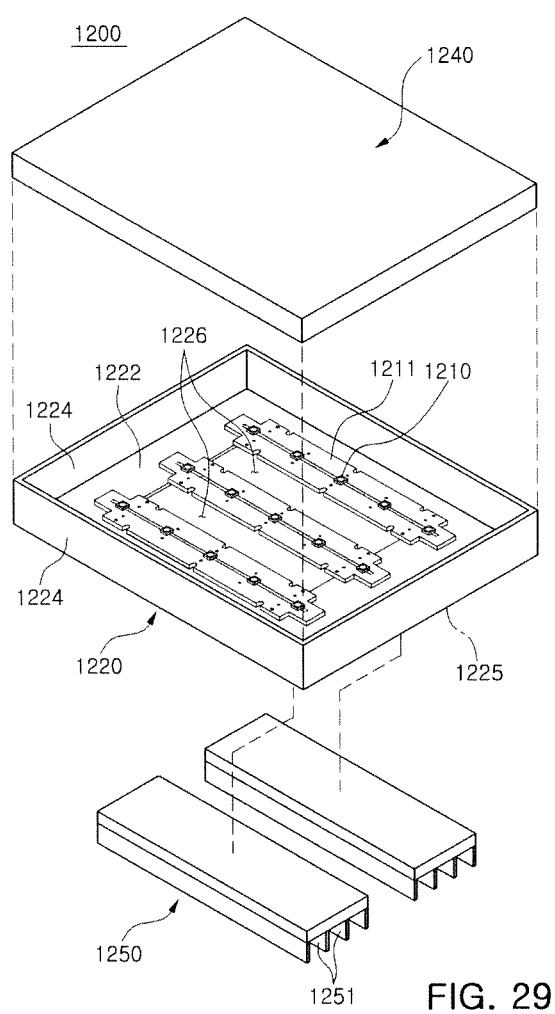
FIG. 29 is an exploded perspective view illustrating a plate-type lighting apparatus according to an exemplary embodiment of the present disclosure.

FIG. 29 is an exploded perspective view schematically illustrating a lighting apparatus according to an exemplary embodiment of the present disclosure. Referring to FIG. 29, a lighting apparatus 1200 may have a surface light source type structure by way of example, and include a light emitting device 1210, a housing 1220, a cover 1240, and a heat sink 1250.

The light emitting device 1210 may be the semiconductor device package of FIG. 22 and thus, detailed descriptions pertaining thereto will be omitted. The light emitting device 1210 may include a plurality of light emitting devices, and the plurality of light emitting devices 1210 may be mounted and arranged on a circuit substrate 1211.

The housing 1220 may have a box-type structure. A surface 1222 of the housing 1220 may have the light emitting device 1210 mounted thereon, and a lateral surface 1224 of the housing 1220 may extend from a circumference of the surface 1222. The housing 1220 may be formed of a material having high thermal conductivity, for example, a metal material, in order to externally dissipate heat generated from the light emitting device 1210.

An opening 1226, into which the heat sink 1250 is inserted and fastened thereto, may be formed on the surface 1222 of the housing 1220 to penetrate therethrough. A circuit substrate 1211 on which the light emitting device 1210 provided on the surface 1222 of the housing 1220 is mounted may be disposed across the opening 1226 to be partially exposed externally.

The cover 1240 may be fastened to the housing 1220 to encapsulate the light emitting device 1210, and may have an overall flat structure.

The heat sink 1250 may be fastened to the opening 1226 through the other surface 1225 of the housing 1220. The heat sink 1250 may be in contact with the light emitting device 1210 through the opening 1226 to externally dissipate heat generated from the light emitting device 1210. The head sink 1250 may include a plurality of heat dissipating fins 1251 to enhance heat dissipating efficiency. The heat sink 1250, similar to the housing 1220, may be formed of a material having high thermal conductivity.

A lighting apparatus using a light emitting device may be largely classified as an indoor lighting apparatus or an outdoor lighting apparatus, according to intended usage thereof. Such an indoor LED lighting apparatus may include an existing lighting fixture, such as a bulb-type lamp, a fluorescent LED-tube light, or a plate-type lighting apparatus. Such an outdoor LED lighting apparatus may include a street light, a security light, a floodlight, a landscape light, a traffic light, and the like.

Also, lighting apparatuses using the light emitting device may be utilized as interior and exterior vehicle light sources. Such an interior vehicle light source may be used as a vehicle interior light, a reading light, a dash light, or the like. Such an exterior vehicle light source may be used for all types of external lights, such as a headlight, a brake light, a turn signal light, a fog lamp, or a daytime running lamp.

The LED lighting apparatus may be used as a light source for a robot, or all types of mechanical equipment. In particular, an LED lighting apparatus using a predetermined wavelength band may stimulate plant growth, stabilize human moods and treat diseases using an emotional lighting apparatus.

As set forth above, according to exemplary embodiments of the present disclosure, the method of manufacturing a semiconductor device package may prevent damage to the package body by reducing the mechanical impacts applied to the LED chip or the body of the LED chip during the process of cutting the base frame into individual light emitting devices, such as the trimming process.

Various advantages and effects in exemplary embodiments of the present disclosure are not limited to the above-described descriptions and may be easily understood through explanations of concrete embodiments of the present disclosure.

While exemplary embodiments have been shown and described above, it will be apparent to those skilled in the art that modifications and variations could be made without departing from the scope of the present invention as defined by the appended claims.

What is claimed is:

1. A method of manufacturing a semiconductor device package, the method comprising:

forming a base frame provided with an outer frame, a plurality of unit frames spaced apart from the outer frame, and a first connector and a second connector forming connections between each of the plurality of unit frames and the outer frame;

forming a package body in each of the plurality of unit frames to provide a mounting area in each unit frame;

removing one of the first connector and the second connector connected to each unit frame; and mounting a semiconductor device in the mounting area of each unit frame after the removing one of the first connector and the second connector connected to each unit frame.

2. The method of claim 1, wherein the plurality of unit frames are disposed at intervals, and the first connector and the second connector are disposed on both sides of each unit frame facing one another.

3. The method of claim 2, wherein the first connector and the second connector extend in a first direction, and one of the first connector and the second connector disposed between the plurality of unit frames further extends in a second direction perpendicular to the first direction so as to be connected to the outer frame.

4. The method of claim 1, wherein each unit frame includes a first lead frame and a second lead frame, and the first connector and the second connector are each connected to both sides of the first lead frame and the second lead frame.

5. The method of claim 1, wherein the mounting of a semiconductor device in the mounting area of each unit frame comprises:

mounting in a flip chip bonding manner using a solder interposed between the mounting area and the semiconductor device.

6. The method of claim 1, wherein the removing of one of the first connector and the second connector connected to each unit frame comprises:

cutting and removing one of the first connector and the second connector in a state in which the outer frame and the package body are supported on a die.

7. The method of claim 1, further comprising: separating of each unit frame from the base frame, including:

cutting and separating the other of the first connector and the second connector connected to each unit frame in the state in which the outer frame is supported on a die.

8. The method of claim 1, further comprising:

forming an encapsulating portion to encapsulate the semiconductor device mounted in the mounting area.

9. The method of claim 8, wherein the package body is provided with a recess opening the mounting area and accommodating the semiconductor device, and the encapsulating portion is formed to fill the recess.

10. The method of claim 1, wherein the removing of one of the first connector and the second connector connected to each unit frame comprises:

cutting and removing one of the first connector and the second connector disposed between the plurality of unit frames.

11. The method of claim 1, wherein the removing of one of the first connector and the second connector connected to each unit frame is a trimming process that comprises:

cutting and removing one of the first connector and the second connector in a state in which the outer frame and the package body are supported on a die, wherein each unit frame and the outer frame maintain a connection via the other of the first connector and the second connector that is not cut.

12. The method of claim 1, wherein the forming a package body in each of the plurality of unit frames to provide a mounting area in each unit frame is performed after the removing one of the first connector and the second connector connected to each unit frame.

13. The method of claim 1, wherein the forming a package body in each of the plurality of unit frames to provide a mounting area in each unit frame, the mounting a semiconductor device in the mounting area of the unit frame, and the removing one of the first connector and the second connector connected to each unit frame are sequentially performed.

14. The method of claim 1, wherein the mounting a semiconductor device in the mounting area of each unit frame is performed before the removing one of the first connector and the second connector connected to each unit frame.

15. The method of claim 1, further comprising:
cutting the other of the first connector and the second connector connected to each unit frame after mounting the semiconductor device in the mounting area of each unit frame.

16. The method of claim 1, wherein removing the one of the first connector and the second connector connected to each unit frame is performed before mounting the semiconductor device in the mounting area of each unit frame.

17. The method of claim 1, wherein the forming a package body in each of the plurality of unit frames is performed before the removing one of the first connector and the second connector connected to each unit frame.

18. The method of claim 15, wherein the forming a package body in each of the plurality of unit frames is performed before the removing one of the first connector and the second connector connected to each unit frame.

19. The method of claim 1, wherein:
the plurality of unit frames are spaced apart from the outer frame by separating grooves interposed therebetween;
forming the package body in each of the plurality of unit frames includes forming the package body in each of the plurality of unit frames to allow a mounting area in each unit frame to be open;
and further comprising:
after the mounting the semiconductor device in the mounting area, cutting the other of the first connector and the second connector connected to each unit frame, and separating, from the base frame, the unit frame in which the package body is formed.

* * * * *